United States Patent [19]
Schmidt et al.

[11] Patent Number: 5,579,193
[45] Date of Patent: Nov. 26, 1996

[54] REDUCING THE NATURAL CURRENT LIMIT IN A POWER MOS DEVICE BY REDUCING THE GATE-SOURCE VOLTAGE

[75] Inventors: Thomas A. Schmidt, Dallas; Ross E. Teggatz, McKinney; Joseph A. Devore, Dallas, all of Tex.

[73] Assignee: Texas Instruments Incorporated, Dallas, Tex.

[21] Appl. No.: 486,926

[22] Filed: Jun. 7, 1995

Related U.S. Application Data

[62] Division of Ser. No. 265,609, Jun. 24, 1994.

[51] Int. Cl.$^6$ ........................................... H02H 7/10
[52] U.S. Cl. ........................... 361/18; 361/91; 363/56
[58] Field of Search ........................... 361/18, 86, 91; 363/56

[56] References Cited

U.S. PATENT DOCUMENTS

| | | | |
|---|---|---|---|
| 4,021,701 | 5/1977 | Davies | 361/18 |
| 4,703,390 | 10/1987 | Fay et al. | 361/18 |
| 4,893,158 | 7/1990 | Mihara et al. | 361/91 |
| 5,303,110 | 4/1994 | Kumagai | 361/18 |

OTHER PUBLICATIONS

*PRISM Power IC Design Aspects*, Ross Teggatz, Joe Devore, Wayne Chen and Tom Schmidt, *TI Technical Journal*, vol. 11, No. 2, Mar.–Apr. 1994, pp. 25–36.

*Primary Examiner*—Todd DeBoer
*Attorney, Agent, or Firm*—Gerald E. Laws; C. Alan McClure; James C. Kesterson

[57] ABSTRACT

In accordance with the present invention, an output current limit circuit for protecting a power MOS output device of an integrated circuit from an excessive drain current comprises a power MOS device 110, sensing circuitry 30 to sense a predetermined trigger current, and limitation circuitry 20 to reduce a gate-source voltage on MOS output device 110 to a predetermined approximately fixed value. A drain current $I_D$ flows through power MOS device 110 from output terminal 102 in response to the gate-source voltage. A short circuit condition may allow an excessive amount of drain current $I_D$ to flow through output terminal 102. The gate-source voltage is reduced in response to sensing the trigger current. Reducing the gate-source voltage raises a drain-source resistance of MOS device 110 and reduces drain current $I_D$ so that MOS device 110 is not damaged by the short circuit condition.

8 Claims, 3 Drawing Sheets

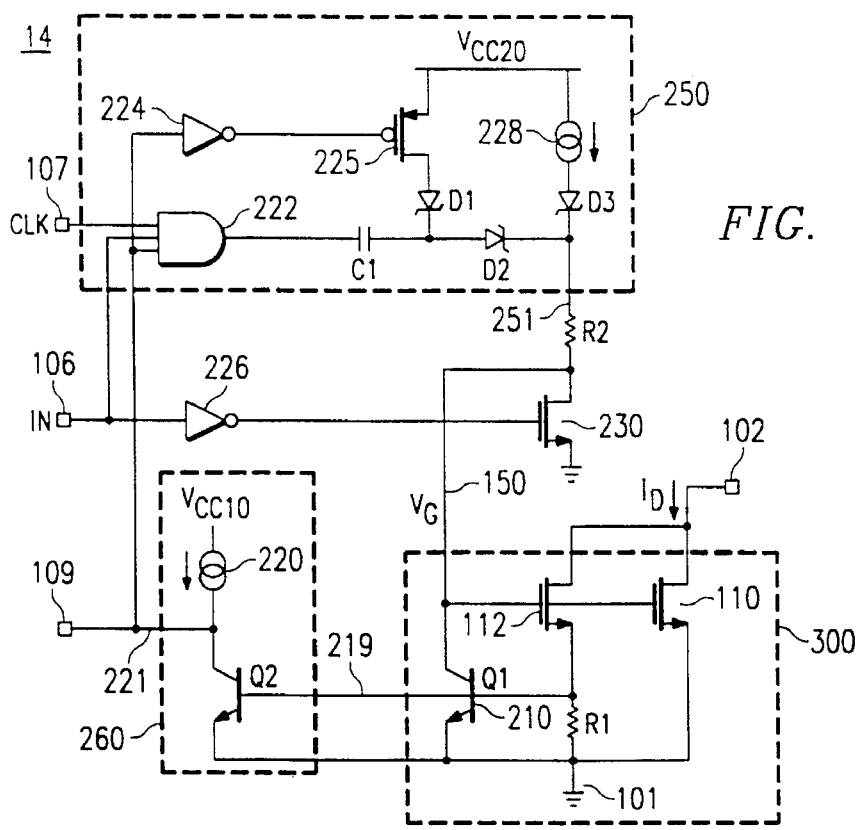
FIG. 6
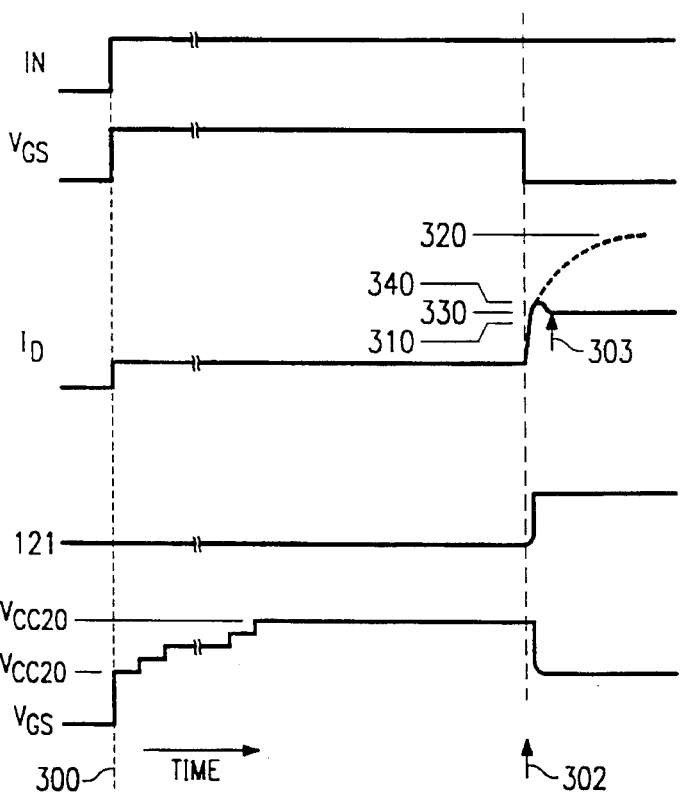
FIG. 7A
FIG. 7B
FIG. 7C
FIG. 7D
FIG. 7E

REDUCING THE NATURAL CURRENT LIMIT IN A POWER MOS DEVICE BY REDUCING THE GATE-SOURCE VOLTAGE

This is a division of application Ser. No. 08/265,609, filed Jun. 24, 1994.

FIELD OF THE INVENTION

This invention is in the field of semiconductor integrated circuits and relates primarily to high voltage power CMOS devices.

BACKGROUND OF THE INVENTION

Intelligent power integrated circuits, referred to as "power ICs," have become increasingly popular for implementing system functions with improved performance, reduced size and lower cost. The automotive industry in particular has made effective use of power ICs to offer improved features in such areas as more efficient engine management systems, safety systems, and comfort features. Power ICs typically have current capabilities ranging from a few milliamps to fifty amps and typically operate at voltages up to 60 volts or higher.

The output transistor of a power IC is typically a metal oxide semiconductor device, referred to as a "MOS" device. MOS devices have improved over the years and now have very low resistance when turned on, referred to as the "drain to source on-resistance," or "$R_{dson}$." $R_{dson}$ may be as low as 0.4 ohms, or less.

In many applications, such as in automotive uses, the wires connected to the power IC may be accidentally shorted to a current source for brief periods of time. When this happens, the current flow may be limited only by $R_{dson}$ of the output transistor. Low values of $R_{dson}$ may allow excessively large currents to flow through the output transistor that may damage or destroy the output transistor.

Techniques have been developed to limit the output current so that the output device is not destroyed, and to allow normal operation to resume when the short circuit condition has been removed. One technique is to detect the temperature of the output transistor, or the entire power IC, and infer that a short circuit condition exists if the temperature exceeds a predetermined limit. The output device may be turned on and off periodically until the temperature is reduced. However, as $R_{dson}$ becomes lower, the current flowing during even brief periods may be large enough to damage the output device or related components. Also, turning on and off a large current may result in undesirable inductive voltage spikes due to inductive loads or length of the wiring harness. Furthermore, temperature sensing may result in other outputs on a multiple output power IC being turned off when they did not need to be.

Another technique is to sense the current flowing through each output device individually and to use an analog feedback loop to reduce the short circuit current to a level that will not damage the output transistor. Once the short circuit condition is removed, the current returns to a normal lower value and the power IC resumes normal operation. A circuit to carry out such a technique is illustrated in prior art FIG. 1. In normal operation, an external load is connected to output terminal 102. Power MOS device 110 acts as a switch to ground, thereby allowing current to flow from an external current source, through the load, and through MOS device 110 to ground. When MOS device 110 is turned off, no current flows through the load.

To sense a short circuit condition, a resistor R10 may be inserted in series with the drain of MOS device 110 and a voltage drop across resistor R10 measured. However, resistor R10 may waste a significant amount of power during normal operation. An improved sensing means is also illustrated in prior art FIG. 1. A MOS device and a resistor may be added in parallel with MOS device 110. Sense MOS device 112 and sense resistor R1 are connected as shown in prior art FIG 1. The current flowing through resistor R1 is determined by the ratio of the series resistance of resistor R1 and $R_{dson}$ of sense MOS device 112 in parallel with $R_{dson}$ of output device 110. As drain current through MOS device 110 increases, the voltage drop across sense resistor R1 will increase proportionally. This voltage is applied to the gate of MOS device 114, which forms a feedback control loop. If the drain current through MOS device 110 becomes excessive, as sensed by resistor R1, MOS device 114 begins to turn on. Turning on MOS device 114 reduces the gate to source voltage, referred to as "$V_{gs}$," that is applied to the gate of MOS device 110, thereby reducing the drain current.

Unfortunately, sense MOS device 112 is debiased by sense resistor R1 and the effective ratio decreases as the feedback pulls down on the gate of output device 110 and sense device 112. This causes a chopping phenomenon on the output as the feedback loop continually compensates for the sense MOS device ratio changing. For low inductive loads, this loop may become unstable.

Accordingly, it is an object of the invention to limit the drain current flowing through the output device of a power IC so that the output device is not damaged.

Another object of the invention is to overcome the problem of instability inherent in a feedback control loop.

Other objects and advantages will be apparent to those of ordinary skill in the art having reference to the following figures and specification.

SUMMARY OF THE INVENTION

In accordance with the present invention, an output current limit circuit for protecting a power MOS device of an integrated circuit from an excessive drain current comprises a power MOS device, a means to sense a predetermined trigger current, and a means to reduce a gate-source voltage on the MOS device to a lower, approximately fixed, value. The power MOS device has a drain connected to an output terminal, a gate, and a source connected to a voltage rail. An input terminal receives an externally provided input signal. A gate-source voltage that is responsive to the input signal is connected to the gate of the power MOS device. A drain current flows through the power MOS device from the output terminal in response to the gate-source voltage. A short circuit condition may allow an excessive amount of drain current to flow through the output terminal. The means to sense a predetermined trigger current is connected to the drain of the power MOS device. The means to reduce the gate-source voltage to a fixed value is connected to the gate of the power MOS device.

The gate-source voltage is reduced in response to sensing the trigger current. Reducing the gate-source voltage raises a drain-source resistance of the MOS device and reduces the drain current so that the MOS device is not damaged by the short circuit condition.

Another feature of the present invention is that the drain current can be reduced to a predetermined value that is approximately fixed and is smaller than the trigger current.

Another advantage is that trigger current sensing means can be compensated to allow for variations in operating parameters of the power MOS device.

Another advantage is that the gate-source voltage reduction means can be compensated to allow for variations in operating parameters of the power MOS device.

BRIEF DESCRIPTION OF THE DRAWINGS

Other features and advantages of the present invention will become apparent by reference to the following detailed description when considered in conjunction with the accompanying drawings; in which:

FIG. 6 illustrates an alternate trigger current sense circuit and a charge pump controlled according to the present invention; and FIGS. 7A–7E illustrate voltage and current relations versus time according to the present invention.

Corresponding numerals and symbols in the different figures and tables refer to corresponding parts unless otherwise indicated.

DETAILED DESCRIPTION OF THE INVENTION

A description of various embodiments of the invention is best understood with reference to the FIGURES.

Figure 2:
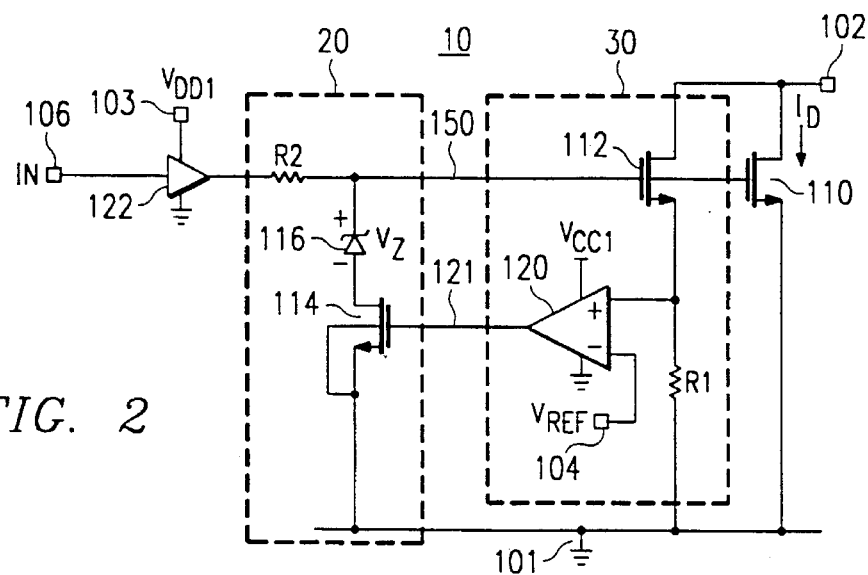
FIG. 2 illustrates a trigger current sensor and means to reduce $V_{gs}$ by a fixed amount according to the present invention.

FIG. 2 illustrates a portion of an intelligent power integrated circuit, hereinafter referred to as "power IC," which has an output current limit circuit 10 that embodies the present invention. A power metal oxide semiconductor device 110, referred to as a "MOS" device, is a typical output driver for a power IC. MOS device 110 has a drain connected to output terminal 102, a source connected to a power rail 101, and a gate connected to signal 150. In typical use of a power IC, an external load device, such as a lamp or a motor, is then connected to output 102. A power source is then connected to the load device and to power rail 101 so that when MOS device 110 is turned on, current flows from the power source through the load device and through the drain and source of MOS device 110. MOS device 110 typically has a very low resistance when turned on, referred to as the "drain to source on-resistance," or "$R_{dson}$."

$R_{dson}$ is primarily controlled by a gate-source voltage, hereinafter referred to as "$V_{gs}$," on signal 150. $V_{gs}$ is typically large in order to minimize $R_{dson}$. $R_{dson}$ may be as low as 0.4 ohms, or less. A short circuit condition may effectively connect a power source to terminal 102. A drain current $I_D$ through MOS device 110 is limited only by $R_{dson}$ of MOS device 110 and may be large enough to damage MOS device 110. According to the present invention, by reducing $V_{gs}$ to a predetermined fixed value that is lower than the normal operating value of $V_{gs}$, $R_{dson}$ is increased and the short circuit drain current is thereby reduced so that MOS device 110 is not damaged.

Still referring to FIG. 2, a means 30 to sense an excessive drain current $I_D$ is connected to the drain of MOS device 110. A means 20 to reduce the $V_{gs}$ of MOS device 110 to a predetermined fixed value is connected to the gate of MOS device 110.

A MOS device 112 is used as a sense device. A gate of sense MOS device 112 is connected to the gate of MOS device 110, a drain of sense MOS device 112 is connected to the drain of MOS device 110, and a source of sense MOS device 112 is connected to one end of sense resistor R1. The other end of resistor R1 is connected to the voltage rail. The use of MOS device 112 as a sensing device is based on the well-known principle that if two devices, such as MOS device 110 and MOS device 112, both have the same length gate and both have the same gate-source voltage and drain-source voltage, then the drain current through MOS device 112 will be proportional to the drain current through MOS device 110. The current ratio is directly related to the ratio of the widths of the gates. For example, if the gate of MOS device 110 is one hundred times wider than the gate of MOS device 112, then the drain current through MOS device 110 will be approximately one hundred times larger than the drain current through MOS device 112. The drain current through sense MOS device 112 can be inferred using Ohm's law by measuring the voltage across sense resistor R1. The approximate drain current through MOS device 110 can then be inferred from the drain current through sense MOS device 112 by using the gate width ratio of MOS device 112 and MOS device 110.

Referring again to FIG. 2, a comparator 120 compares the voltage across sense resistor R1 to an externally provided reference voltage $V_{ref}$ connected to terminal 104. Comparator 120 is connected to supply voltage $V_{cc1}$. When the voltage across sense resistor R1 is larger than the voltage on terminal 104, output 121 of the comparator goes from a low voltage level, typically approximately zero volts, to a higher voltage level, typically approximately $V_{cc1}$, to indicate that a certain amount of drain current, hereinafter referred to as a "trigger current," is flowing through MOS device 110. Sense resistor R1, which may be a metal resistor, polysilicon, or other resistive means, may be selected to have a resistance value of approximately 300 ohms, for example. The gate width of sense MOS device 112 is selected so that when the trigger current is flowing through MOS device 110 approximately 4 ma is flowing through sense MOS device 112. $V_{ref}$ is approximately 1.2 volts. The resistance of MOS device 112, the gate width ratio, and the value of $V_{ref}$ may be varied proportionally.

Continuing to refer to FIG. 2, the output 121 of comparator 120 is connected to a control input of switch means 114. An output of switch 114 is connected to the voltage rail 101. An input of switch 114 is connected to an output of voltage dropping device 116. An input of voltage dropping device 116 is connected to signal line 150 that is connected to the gate of MOS device 110, the gate of sensing MOS device 112, and an output of impedance device R2. An input of impedance device R2 is connected to an output of buffer 122. An input of buffer 122 is connected to terminal 106, to which is connected to an externally generated input signal. Input buffer 122 is powered by a voltage $V_{dd1}$ connected to terminal 103. Switch means 114 may be a MOS device or a bipolar transistor, for example. Impedance device R2 may be a resistor, polysilicon, or a current source, for example. Input buffer 122 may be a unity gain amplifier, an amplifier, an invertor, or a logic device, for example. An output signal produced by buffer 122 has a value approximately equal to $V_{dd1}$. Voltage dropping device 116 may be any device that produces an approximately constant voltage drop, such as a zener diode, for example.

Continuing to refer to FIG. 2, during normal operation of circuit 10, current flowing through MOS device 110 is less than the trigger current value and switch 114 is off. When the output of buffer 122 is high in response to the input signal on terminal 106, a $V_{gs}$ approximately equal to $V_{dd1}$ is formed on signal 150. MOS device 110 is turned on and $R_{dson}$ of MOS device 110 is low. If a short circuit condition is created on terminal 102, the drain current through MOS device 110 increases substantially. If the drain current through MOS device 110 exceeds the trigger current, output 121 of comparator 120 goes to a higher voltage to indicate the detection of the trigger current and switch 114 is turned on. When switch 114 is on, voltage dropping device 116 is coupled between the gate and source of MOS device 110 and current flows from the output of buffer 122 through impedance device R2 to voltage rail 101. The voltage on signal 150, $V_{gs}$ of MOS device 110, is reduced to approximately the voltage across voltage dropping device 116. Reducing $V_{gs}$ raises $R_{dson}$ of MOS device 110 and thereby limits drain current $I_D$. Voltage dropping device 116 is selected to produce a limited drain current value that does not damage MOS device 110.

In order to more fully understand the operation of the present invention, refer to FIGS. 7A–7D that illustrate the action of certain currents and voltages over time. FIG. 7A illustrates an input signal that is applied to terminal 106. The input signal transitions from a "low" to a "high" at time 300. This transition starts the process of turning on MOS device 110 that in turn will apply power to an external device connected to terminal 102. FIG 7B illustrates the $V_{gs}$ signal that is formed on signal 150. At time 300, signal 150 transitions from approximately zero volts to approximately $V_{dd1}$ volts in response to the transition of the input signal on terminal 106. $V_{dd1}$ may be 12 volts, for example. In response to $V_{gs}$, MOS device 110 is turned on and has a low $R_{dson}$, for example one ohm. FIG. 7C illustrates a drain current $I_D$ that flows through MOS device 110. After MOS device 110 is turned on at time 300, the drain current may be one amp, for example, which is supplied by an external power source that may be 12 volts, for example. Later in time, a short circuit condition at time 302 will cause the drain current to increase. Since in this example the external power source is 12 volts and $R_{dson}$ is one ohm, the drain current would be naturally limited at approximately 12 amps, as shown at drain current 320. However, 12 amps may destroy MOS device 110.

When the drain current shown in FIG. 7C reaches a trigger current 310, which may be two amps for example, the voltage across sense resistor R1 exceeds the reference voltage at terminal 104. In this case, the gate width ratio of sense MOS device 112 and MOS device 110 is selected to be 500 so that 4 ma flows through sense resistor R1 when two amps flow through the MOS device 110. FIG. 7D illustrates output signal 121 of comparator 120 after time 302 as output 121 responds and turns on switch 114. Voltage dropping device 116 then reduces $V_{gs}$ as shown in FIG. 7B after time 302. In this example, $V_{gs}$ may be reduced to approximately six volts, for example. $R_{dson}$ of MOS device 110 is raised in response to reduced $V_{gs}$, for example, to approximately five ohms and the current through MOS device 110 is now advantageously limited to approximately 2.4 amps at time 303. A drain current of 2.4 amps is low enough so that MOS device 110 is not damaged. Voltage dropping device 116 is selected to produce a reduced $V_{gs}$ that causes $R_{dson}$ of MOS device 110 to increase enough to limit the drain current to a safe level. The appropriate value of the reduced $V_{gs}$ will vary depending on the operating characteristics of MOS device 110. $V_{gs}$ is selected so that the limited drain current 330 is larger than the trigger current 310 so that comparator 120 continues to detect a trigger current until the short circuit condition is removed.

As shown in FIG. 7C, there is some delay from time 302 when the trigger current is reached and time 303 when the limited drain current is in effect. The delay is due to a propagation delay of the circuit. A current spike 340 may result. In theory, a short circuit condition could cause an immediate rise in the drain current and damage device 110 before the drain current is limited. In practice, parasitic capacitance, lead length inductance, and inductance of the load limit the rise time of the drain current so that current spike 340 is not a problem.

Comparator 120 may be implemented with hysteresis so that once the trigger current 310 is detected and output 121 goes high, output 121 will remain high even if drain current $I_D$ is reduced below the trigger current. Then, $V_{gs}$ can be selected so that the limited drain current 330 is less than the trigger current 310.

Figure 3:
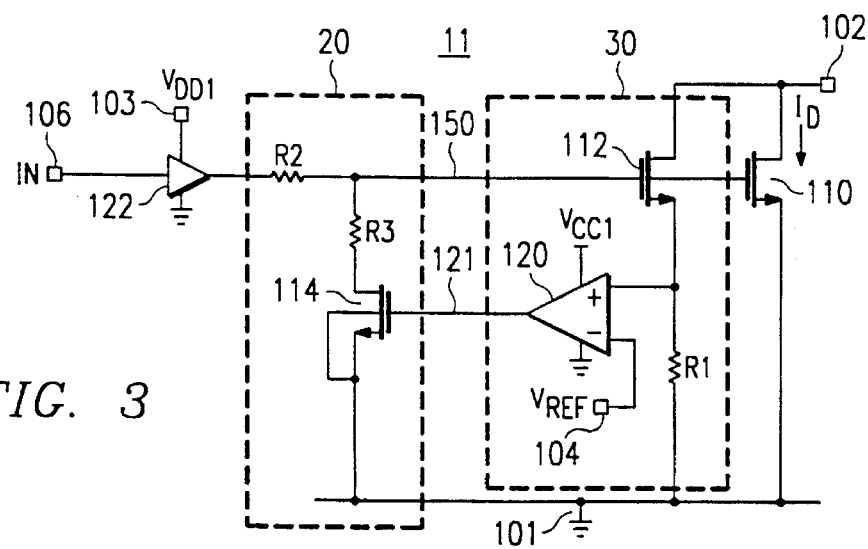
FIG. 3 illustrates the sensor of FIG. 2 and another way to reduce $V_{gs}$ by a fixed amount.

FIG. 3 illustrates a portion of a power IC having an output current limit circuit 11 that embodies the present invention. In limit circuit 11, an impedance device R3 replaces voltage dropping device 116. When output 121 goes high in response to detection of a trigger current by comparator 120, impedance device R3 is connected to voltage rail 101 by switch 114. Impedance device R3 forms an impedance divider with impedance device R2 so that $V_{gs}$ on signal 150 is reduced. R2 may be selected to be 20,000 ohms and R3 selected to be 10,000 ohms, for example. Impedance device R3 may be a resistor, polysilicon, or a current source, for example.

During normal operation of circuit 11, current flowing through MOS device 110 is less than the trigger current value and switch 114 is off. When the output of buffer 122 is high in response to the input signal on terminal 106, a $V_{gs}$ approximately equal to $V_{dd1}$ is formed on signal 150. MOS device 110 is turned on and $R_{dson}$ of MOS device 110 is low. If a short circuit condition is created on terminal 102, the drain current through MOS device 110 increases substantially. If the drain current through MOS device 110 exceeds the trigger current, output 121 of comparator 120 goes to a higher voltage to indicate the detection of the trigger current and switch 114 is turned on. When switch 114 is on, impedance device R3 allows current to flow from the output of buffer 122 through impedance device R2 to voltage rail 101. The voltage on signal 150, $V_{gs}$ of MOS device 110, is reduced to approximately the ratio of the impedance of device R3 to the sum of the impedance of device R2 and R3. For example, if $V_{dd1}$ is approximately 12 volts, R2 is 10,000 ohms and R3 is 20,000 ohms, then $V_{gs}$ will be reduced from approximately 12 volts to approximately 10,000/(10,000+20,000) or one-third of 12 volts which is four volts. Impedance devices R2 and R3 are selected to produce a limited $V_{gs}$ on signal 150 so that $R_{dson}$ of MOS device 110 is raised and the drain current of MOS device 110 is thereby reduced to a limited drain current value that does not damage MOS device 110.

Figure 4:
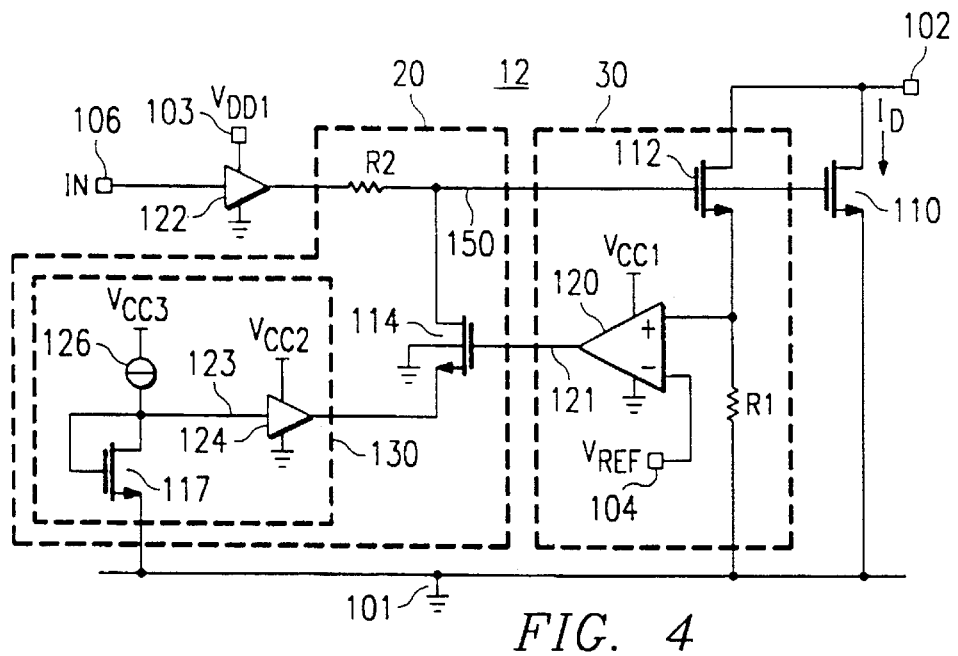
FIG. 4 illustrates the sensor of FIG. 2 and a compensated circuit to reduce $V_{gs}$ according to the present invention.

FIG. 4 illustrates a portion of a power IC having an output current limit circuit 12 that embodies the present invention. In limit circuit 12, a compensated $V_{gs}$ generator 130 replaces voltage dropping device 116. $V_{gs}$ generator 130 has a current source 126 that is connected to signal 123 and provides a reference limited current to the drain of MOS device 117. The gate of MOS device 117 is connected to the drain of MOS device 117. The source of device 117 is connected to the voltage rail 101. Amplifier 124 is a unity gain amplifier that forms a buffered version of signal 123 on the output of amplifier 124. The output of amplifier 124 is connected to the output of switch 114. The input of switch 114 is connected to signal 150.

MOS device 117 is constructed similarly to MOS device 110. The gate width of MOS device 117 is a known ratio of the gate width of device 110. The reference limited current provided by current source 126 is passed through MOS device 117, and a limited $V_{gs}$ will be formed on signal 123. If the limited $V_{gs}$ is applied to signal 150, then MOS device 110 will limit drain current $I_D$ through MOS device 110 to an amount that is the gate width ratio of the reference limit current. For example, if the gate width of MOS device 110 is 500 times larger than the gate width of MOS device 117, then the limited current through MOS device 110 will be 500 times larger than the reference limited current through MOS device 117. Thus, for this example, a reference limited current of 5 ma would produce a limit current of 2.5 amps in MOS device 110. Both MOS devices 110 and 117 are processed similarly, so MOS device 117 forms a limited $V_{gs}$ that is advantageously compensated for variations in operational parameters of MOS device 110.

During normal operation of circuit 12 shown in FIG. 4, current $I_D$ flowing through MOS device 110 is less than the trigger current value and switch 114 is off. When the output of buffer 122 is high in response to the input signal on terminal 106, a $V_{gs}$ approximately equal to $V_{dd1}$ is formed on signal 150. MOS device 110 is turned on and $R_{dson}$ of MOS device 110 is low. If a short circuit condition is created on terminal 102, drain current $I_D$ through MOS device 110 increases substantially. If drain current $I_D$ through MOS device 110 exceeds the trigger current, output 121 of comparator 120 goes to a higher voltage to indicate the detection of the trigger current and switch 114 is turned on. When switch 114 is on, a current flows from the output of buffer 122 through impedance device R2 to the output of amplifier 124. Signal 150 is pulled down due to a voltage drop across impedance device R2. The voltage on signal 150, $V_{gs}$ of MOS device 110, is reduced to approximately the value formed on the output of amplifier 124. Thus, $V_{gs}$ on signal 150 is limited so that $R_{dson}$ of MOS device 110 is raised and drain current $I_D$ of MOS device 110 is thereby reduced to a limited drain current value that does not damage MOS device 110. Furthermore, the limited drain current is advantageously accurately controlled because MOS device 117 compensates for variations in operational parameters of MOS device 110.

Figure 5:
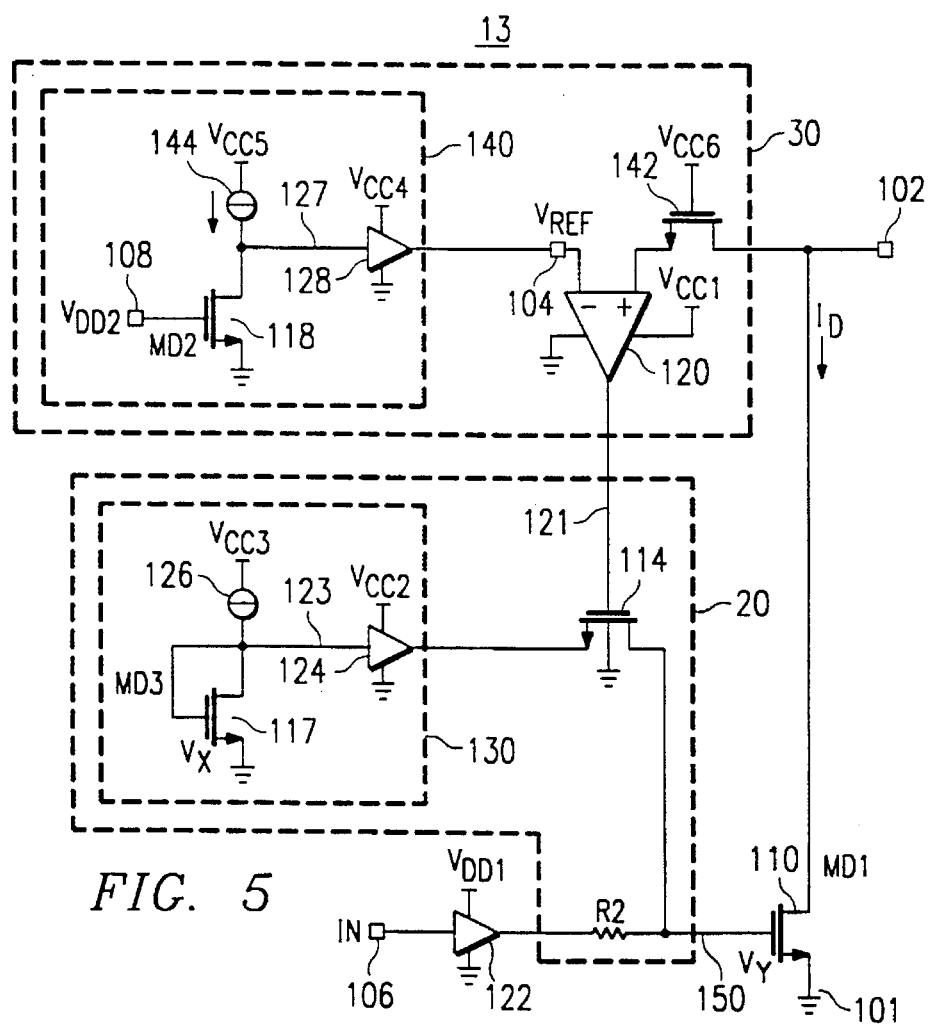
FIG. 5 illustrates a compensated sensor trigger current circuit according to the present invention and the compensated $V_{gs}$ reduction circuit of FIG. 4.

FIG. 5 illustrates a portion of a power IC having an output current limit circuit 13 that embodies the present invention. In limit circuit 13, a compensated trigger current reference voltage generator 140 is connected to terminal 104 that connects to an input of comparator 120. Sense MOS device 142 connects a drain-source voltage of output device 110, hereinafter referred to as "$V_{ds}$," to the other input of comparator 120. Reference voltage generator 140 has current source 144 that is connected to signal 127 and provides a reference trigger current to the drain of MOS device 118. Voltage $V_{dd2}$ is applied to terminal 108. Terminal 108 is connected to the gate of MOS device 118. Typically, $V_{dd2}$ is the same value as voltage $V_{dd1}$. The source of device 118 is connected to the voltage rail 101. Amplifier 128 is a unity gain amplifier that forms a buffered version of signal 127 on the output of amplifier 128. The output of amplifier 128 is connected to terminal 104.

MOS device 118 is constructed similarly to MOS device 110. The gate width of MOS device 118 is a known ratio of the gate width of device 110. The reference trigger current from current source 144 is passed through MOS device 118, and a reference $V_{ds}$ will be formed on signal 127. The reference $V_{ds}$ is compared to a $V_{ds}$ on output device 110 by comparator 120. Thus, $V_{ds}$ across output device 110 will be equal to the reference $V_{ds}$ on terminal 104 when a drain current through output device 110 is equal to a current that is the gate width ratio of the reference trigger current provided by current source 144. For example, if the gate width of MOS device 110 is 500 times larger than the gate width of MOS device 118, then the trigger current through MOS device 110 will be 500 times larger than the reference trigger current through MOS device 118. Thus, for this example, a reference trigger current of 5 ma would sense a trigger current of 2.5 amps in MOS device 110. Both MOS devices 110 and 118 are processed similarly, so MOS device 118 forms a reference $V_{ds}$ that is advantageously compensated for variations in operational parameters of MOS device 110.

$V_{gs}$ generator 130 has a current source 126 that is connected to signal 123 and provides a reference limited current to the drain of MOS device 117. The gate of MOS device 117 is connected to the drain of MOS device 117. The source of device 117 is connected to the voltage rail 101. Amplifier 124 is a unity gain amplifier that forms a buffered version of signal 123 on the output of amplifier 124. The output of amplifier 124 is connected to the output of switch 114. The input of switch 114 is connected to signal 150.

MOS device 117 is constructed similarly to MOS device 110. The gate width of MOS device 117 is a known ratio of the gate width of device 110. The reference limited current is passed through MOS device 117, and a limited $V_{gs}$ will be formed on signal 123. If the limited $V_{gs}$ is applied to signal 150, then MOS device 110 will limit drain current $I_D$ through MOS device 110 to an amount that is the gate width ratio of the reference limited current. For example, if the gate width of MOS device 110 is 500 times larger than the gate width of MOS device 117, then the limited current through MOS device 110 will be 500 times larger than the reference limited current through MOS device 117. Thus, for this example, a reference limited current of 5 ma would produce a limited current of 2.5 amps in MOS device 110. Both MOS devices 110 and 117 are processed similarly, so MOS device 117 forms a limited $V_{gs}$ that is advantageously compensated for variations in operational parameters of MOS device 110.

During normal operation of circuit 13 shown in FIG. 5, current $I_D$ flowing through MOS device 110 is less than the trigger current value as indicated by reference $V_{ds}$ on terminal 104 and switch 114 is off. When the output of buffer 122 is high in response to the input signal on terminal 106, a $V_{gs}$ approximately equal to $V_{dd1}$ is formed on signal 150. MOS device 110 is turned on and $R_{dson}$ of MOS device 110 is low. If a short circuit condition is created on terminal 102, drain current $I_D$ through MOS device 110 increases substantially. If drain current $I_D$ through MOS device 110 exceeds the trigger current value, $V_{ds}$ of output device 110 will exceed the reference $V_{ds}$ on terminal 104 and the output of comparator 120 will go active and turn on switch 114.

Continuing to refer to FIG. 5, when switch 114 is on, a current flows from the output of buffer 122, through impedance device R2 and to the output of amplifier 124. Signal 150 is pulled down due to a voltage drop across impedance device R2. The voltage on signal 150, $V_{gs}$ of MOS device 110, is reduced to approximately the value formed on the output of amplifier 124. Thus, $V_{gs}$ on signal 150 is limited so that $R_{dson}$ of MOS device 110 is raised and drain current $I_D$ of MOS device 110 is thereby reduced to a limited drain current value that does not damage MOS device 110.

Thus, the embodiment of the present invention illustrated in FIG. 5 senses a trigger current in output device 110 that is advantageously controlled because MOS device 118 compensates for variations in operational parameters of MOS device 110. Furthermore, a limited drain current is advantageously accurately controlled because MOS device 117 compensates for variations in operational parameters of MOS device 110.

FIG. 6 illustrates a portion of a power IC having an output current limit circuit 14 that embodies the present invention. Limit circuit 14 has a charge pump 250 that is used to increase the value of a $V_{gs}$ on signal 150 to a value that is approximately twice the value of a voltage $V_{cc20}$, as is well known by persons skilled in the art. MOS device 110 has a drain connected to output terminal 102, a source connected to a voltage rail 101, and a gate connected to signal 150. A sense MOS device 112 has a drain connected to output terminal 102, a source connected to an input of sense resistor R1, and a gate connected to signal 150. An output of sense resistor R1 is connected to the voltage rail 101. Comparator 260 has an input 221 connected to the source of sense MOS device 112 and an output signal 221 connected to an input of charge pump 250. According to the present invention, when comparator 260 senses a trigger current in MOS device 110, signal 221 is activated to turn off charge pump 250 and thereby advantageously reduce voltage $V_{gs}$ on signal 150 to a predetermined lower fixed value. Reducing $V_{gs}$ on signal 150 raises $R_{dson}$ so that a drain current through MOS device 110 is limited to a value that does not damage device 110.

Continuing to refer to FIG. 6, charge pump 250 has an AND gate 222 that has an input connected to signal 221. AND gate 222 also has an input connected to input terminal 106, another input connected to terminal 107 and an output connected to capacitor C1. An invertor 224 has an input connected to signal 221 and an output connected to a control input of a switch 225. An externally generated clock signal CLK is connected to terminal 107, and an externally generated input signal IN is connected to terminal 106. Input terminal 106 is also connected to an input of invertor 226. An output of invertor 226 is connected to a control input of switch 230. An input of switch 230 is connected to signal 150 and an output of switch 230 is connected to power rail 101. In normal operation when a trigger current has not been detected, signal 221 is high and switch 225 is turned on. When signal IN is low, switch 230 connects signal 150 to voltage rail 101 and MOS device 110 is turned off.

When signal IN on terminal 106 is high, AND gate 222 applies a clock signal to capacitor C1 that causes a voltage on signal 150 to be pumped up to a value that is approximately twice $V_{cc20}$, as shown in FIG. 7E after time 300. Operation of a charge pump is well known by those skilled in the art. During normal operation of circuit 14 shown in FIG. 6, current flowing through MOS device 110 is less than the trigger current value and signal 221 is high. When the input signal on terminal 106 is high, a $V_{gs}$ approximately equal to $V_{cc20}$ is formed on signal 150 by charge pump 250. MOS device 110 is turned on and $R_{dson}$ of MOS device 110 is low. If a short circuit condition is created on terminal 102, the drain current through MOS device 110 increases substantially. If the drain current through MOS device 110 exceeds the trigger current, output 221 of comparator 260 goes to a lower voltage to indicate the detection of the trigger current. According to the present invention, when signal 221 is low the output of AND gate 222 is low and switch 225 is turned off, which inhibits the pump operation of charge pump 250. Signal 150 is limited to approximately $V_{cc20}$, as shown in FIG. 7E after time 302. Thus, $V_{gs}$ on signal 150 is limited to a predetermined value so that $R_{dson}$ of MOS device 110 is raised and drain current $I_D$ of MOS device 110 is thereby reduced to a limited drain current value that does not damage MOS device 110.

Comparator 260 illustrated in FIG. 6 is an alternate means of sensing a trigger current in MOS device 110 according to the present invention. Comparator 260 has a current source 220 connected to a collector of a transistor Q2, reffered to as an input of Q2. The collector of transistor Q2 is also the output of comparator 260. Transistor Q2 has an emitter, referred to as an output of Q2, connected to power rail 101 and a base, referred to as a control input, connected to signal 219. Transistor Q2 may be a bipolar transistor or a MOS device, for example. For a MOS device, the input is a drain, the output is a source and the control input is a gate. Sense MOS device 112 causes a current to flow through sense resistor R1 that is a known ratio of the current flowing in MOS device 110, as described earlier. The value of R1 is selected so that a voltage approximately equal to the turn-on base-emitter voltage, referred to hereinafter as "$V_{be}$," of transistor Q2 is formed on signal 219 when a trigger current is present in MOS device 110. For example, if a trigger current in MOS device 110 is 2.5 amps and the base width ratio of sense MOS device 112 is 500, then a current of 5 ma will flow through sense MOS device 112. If the $V_{be}$ to turn on transistor Q2 is 0.8 volts, then sense resistor R1 is selected to have a resistance of approximately 160 ohms. Thus, when a trigger current flows through MOS device 110, transistor Q2 will be turned on. When transistor Q2 is turned on, the output signal of comparator 260 is a low logic level to indicate that a trigger current is detected.

Figure 1:
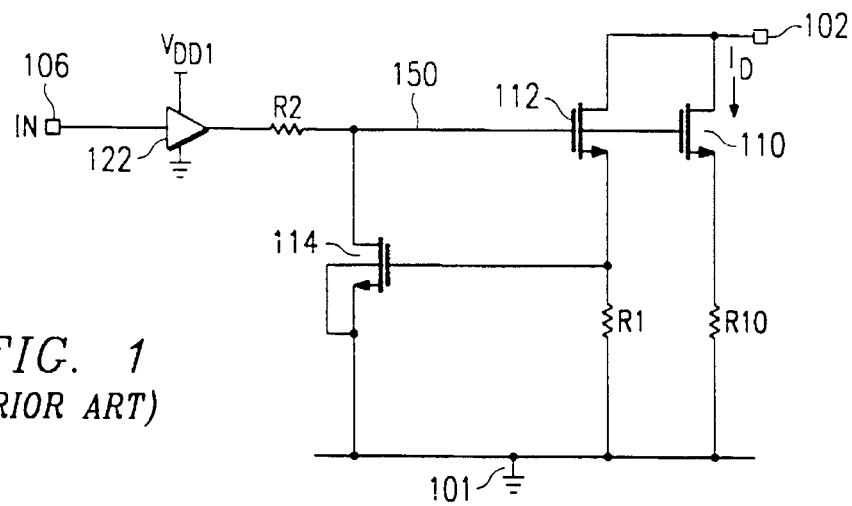
FIG. 1 illustrates a prior art feedback control loop.

FIG. 6 illustrates another aspect of the present invention. Transistor Q1, MOS device 110, sense MOS device 112 and sense resistor R1 forms a feedback loop 300 similar to MOS device 114, MOS device 110, sense MOS device 112 and sense resistor R1 in prior art FIG. 1. An input of transistor Q1 is connected to signal 150, an output of transistor Q1 is connected to voltage rail 101 and a control node of transistor Q1 is connected to signal 219. According to the present invention, when a trigger current is detected in MOS device 110, $V_{gs}$ on signal 150 is reduced to a predetermined fixed value. Reducing signal 150 to a lower voltage advantageously reduces feedback loop instability so that a feedback control loop 300 can more easily be used to accurately regulate a limited drain current in MOS device 110.

The present invention can be advantageously applied to many forms of power ICs to detect a trigger current and to limit the drain current in the output device by raising $R_{dson}$ to a predetermined value so that the output device is not damaged. The output device may advantageously be either NMOS or PMOS by appropriate selection of the voltage rail.

Another advantage of the present invention ms that hysteresis may be incorporated in the trigger current sense means so that the drain current in the output device can be limited to a lower value than the trigger current.

Another feature of the present invention is that a trigger current sensing means is compensated for variations in the operating parameters of the output device so that a trigger current is accurately sensed.

Another feature of the present invention is that a means to reduce $V_{gs}$ to a predetermined fixed value is compensated for variations in the operating parameters of the output device so that a limited drain current is accurately provided.

Another feature of the present invention ms that any of the means for detecting a trigger current, as illustrated in FIGS. 2–6, can be combined with any of the means for limiting the drain current, as illustrated in FIGS. 2–6.

Another aspect of the present invention ms that it reduces instability in a feedback control loop when combined with a feedback control loop to regulate the drain current in the output device.

Another aspect of the present invention is that it can be combined with a circuit to periodically turn the output device on and off when a trigger current is detected. Inductive spikes are advantageously reduced by reducing the drain current of the output device.

Another aspect of the present invention is that it may be combined with circuitry to inhibit detection of a trigger current for a time period after the output device is turned on so that an initial current surge is advantageously not detected as a short circuit condition.

As used herein, the terms "applied," "connected," and "connection" mean electrically connected, including where additional elements may be in the electrical connection path.

While the invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modifications of the embodiments as fall within the true scope and spirit of the invention.

What is claimed is:

1. A circuit to protect a power MOS device of an integrated circuit from an excessive drain current, the MOS device having a source, a gate with a gate-source voltage thereon and an input terminal communicating therewith for receiving an externally provided input signal, and a drain connected to an output terminal of the integrated circuit; the circuit comprising:

means for sensing trigger current which produces a trigger signal if the drain current exceeds a selected trigger current value; and means responsive to the trigger signal for reducing the gate-source voltage by coupling to the gate and the source a facility that reduces the gate-source voltage to a selected approximately constant value;

wherein the means for sensing trigger current further comprises:

a means for creating a compensated trigger current reference voltage;

a comparator having an input connected to the compensated trigger current reference voltage and another input connected to the drain of the power MOS device; and an output of the comparator connected to the means for reducing gate-source voltage; and wherein the means for creating a compensated trigger current reference voltage further comprises a transistor of the same type as the power MOS device, having a source connected to the source of the power MOS device, a gate connected to a supply voltage, and a drain, the transistor having a gate whose width is a second known ratio of the width of the gate of the power MOS device; and a means for generating a reference trigger current that is a known ratio of the selected trigger current value connected to the drain of the transistor.

2. The circuit of claim 1 for protecting a power MOS device of an integrated circuit from an excessive drain current, wherein:

the approximately constant gate-source voltage is selected to produce a limited drain current in the power MOS device that is smaller than the selected trigger current value.

3. The circuit of claim 1 for protecting a power MOS device of an integrated circuit from an excessive drain current, in which:

means for sensing trigger current removes the trigger signal if the drain current ceases to exceed a selected drain current value; and means for reducing the gate-source voltage restores the gate-source voltage in response to the trigger signal being removed.

4. The circuit of claim 1 for protecting a power MOS device of an integrated circuit from an excessive drain current, wherein the means for reducing the gate-source voltage further comprises:

the input terminal connected first to an input of a buffer, an output of the buffer connected to an input of an impedance device, and an output of the impedance device connected to the gate of the power MOS device;

a voltage dropping device having an input terminal connected between the impedance device and the gate of the power MOS device, the voltage dropping device having an approximately fixed voltage drop; and a switching means that is responsive to the trigger current sensing means and having an input connected to an output of the impedance device and an output connected to the source of the MOS device, the switching means being conductive when the trigger current sense means detects the selected trigger current value.

5. The circuit of claim 1 for protecting a power MOS device of an integrated circuit from an excessive drain current, wherein the means for reducing the gate-source voltage further comprises:

the input terminal connected first to an input of a buffer, an output of the buffer connected to an input of a first impedance device, and an output of the first impedance device connected to the gate of the power MOS device;

a second impedance device having an input terminal connected between the first impedance device and the gate of the power MOS device; and a switching means that is responsive to the trigger current sensing means and having an input connected to an output of the second impedance device and an output connected to the source of the MOS device, the switching means being conductive when the trigger current sense means detects the trigger current.

6. A circuit to protect a power MOS device of an integrated circuit from an excessive drain current, the MOS device having a source, a gate with a gate-source voltage thereon and an input terminal communicating therewith for receiving an externally provided input signal, and a drain connected to an output terminal of the integrated circuit; the circuit comprising:

means for sensing trigger current which produces a trigger signal if the drain current exceeds a selected trigger current value; and means for reducing the gate-source voltage by coupling to the gate and the source a facility that reduces the gate-source voltage to a selected approximately constant value in response to the trigger signal;

wherein the means for reducing the gate-source voltage further comprises:

the input terminal connected first to an input of a buffer, an output of the buffer connected to an input of an impedance device, and an output of the impedance device connected to the gate of the power MOS device;

a switching means that is responsive to the trigger current sensing means and having an input connected between the impedance device and the gate of the MOS device and an output, the switching means being conductive when the trigger current sense means detects the selected trigger current value;

a compensated gate-source voltage generator having a first terminal connected to the output of the switching means and a second terminal connected to the source of the MOS device;

the compensated gate-source voltage generator further comprises:

a transistor of the same type as the power MOS device, having a gate and a drain connected to the first terminal of the compensated gate-source voltage generator, and a source connected to the second terminal of the compensated gate-source voltage generator, the transistor having a gate whose width is a first known ratio of the width of the gate of the power MOS device; and a means for generating a predetermined reference limited current having an output connected to the drain and gate of the transistor, the reference limited current having a value that is the first known ratio of a selected limited drain current.

7. The circuit of claim 6 for protecting a power MOS device of an integrated circuit from an excessive drain current, wherein the means for sensing trigger current further comprises:

a means for creating a compensated trigger current reference voltage;

a comparator having an input connected to the compensated trigger current reference voltage and another input connected to the drain of the power MOS device; and an output of the comparator connected to the means for reducing gate-source voltage.

8. The circuit of claim 7, wherein the means for creating a compensated trigger current reference voltage further comprises:

a second transistor of the same type as the power MOS device, having a source connected to the source of the power MOS device, a gate connected to a supply voltage, and a drain, the second transistor having a gate whose width is a second known ratio of the width of the gate of the power MOS device; and a means for generating a reference trigger current that is a second known ratio of the selected trigger current value connected to the drain of the second transistor.

* * * * *